(12) United States Patent
Sakemi et al.

(10) Patent No.: US 6,245,394 B1
(45) Date of Patent: *Jun. 12, 2001

(54) FILM GROWTH METHOD AND FILM GROWTH APPARATUS CAPABLE OF FORMING MAGNESIUM OXIDE FILM WITH INCREASED FILM GROWTH SPEED

(75) Inventors: Toshiyuki Sakemi; Masaru Tanaka, both of Niihama (JP)

(73) Assignee: Sumitomo Heavy Industries, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,164

(22) Filed: Jan. 13, 1998

(30) Foreign Application Priority Data

Jan. 14, 1997 (JP) .................................................. 9/004333

(51) Int. Cl.[7] .................................................. C23C 14/08
(52) U.S. Cl. .......................... 427/529; 427/562; 427/564; 427/126.3
(58) Field of Search ................................ 427/126.3, 562, 427/564, 529

(56) References Cited

U.S. PATENT DOCUMENTS

| 4,951,604 | * | 8/1990 | Temple et al. . |
| 5,009,922 | * | 4/1991 | Harano et al. . |
| 5,055,169 | * | 10/1991 | Hock et al. . |
| 5,378,506 | * | 1/1995 | Imai et al. . |
| 5,849,370 | * | 12/1998 | Lee et al. . |

FOREIGN PATENT DOCUMENTS 7-316794    12/1995 (JP) .

* cited by examiner

*Primary Examiner*—Timothy Meeks
(74) *Attorney, Agent, or Firm*—Burns, Doane, Swecker & Mathis, LLP

(57) ABSTRACT

An auxiliary anode (30) having a ring-shaped permanent magnet (31) is placed in a vacuum chamber (11) such that the auxiliary anode is coaxial with a central axis of a hearth (20) and is positioned so as to surround an upper area of the hearth. A plasma beam generated by a plasma beam generator (13) using arc discharge is guided into the hearth. Magnesium (Mg) is used as a vaporization material on the hearth. Gas mixed with oxygen is supplied into the vacuum chamber. As a result, magnesium oxide particles sublimated from the hearth react with oxygen plasma generated by the plasma to form a magnesium oxide (MgO) film on a substrate (40).

10 Claims, 3 Drawing Sheets

FILM GROWTH METHOD AND FILM GROWTH APPARATUS CAPABLE OF FORMING MAGNESIUM OXIDE FILM WITH INCREASED FILM GROWTH SPEED

BACKGROUND OF THE INVENTION

The present invention relates to a film growth method and a film growth apparatus using plasma. More particularly, the present invention relates to a film growth method and a film growth apparatus for forming magnesium oxide (MgO) films on substrates.

In plasma display panels (PDP in the following), MgO is normally used for the protective films for discharge cells. In general, wet methods like coating and dry methods like vacuum vapor deposition are used for the formation of MgO films. Films formed by the dry methods have film qualities that are superior to films formed by the wet methods. Thus, the use of the dry methods in the formation of the MgO films is more common.

In terms of the dry methods, there is vacuum vapor deposition using an electron gun and sputtering. Since vacuum vapor deposition forms films at higher speeds than the sputtering, it is more commonly used. A film growth speed or rate with vacuum vapor deposition that uses the electron gun depends on output power of the electron gun, but it is generally 20–40 (Å/s). If the output power of the electron gun is too great, problems, such as splashing in the tablets, or vaporization material, arise.

On the other hand, when MgO is used for the tablets in radio frequency (RF) ion plating, an operating pressure of $10^{-3}$ to $10^{-4}$ Torr is necessary for generating the plasma. However, since this operating pressure hinders the vaporization of MgO, the film growth speed is reduced. The greater the vacuum is below $10^{-4}$ Torr, the easier it is for MgO to vaporize. On the other hand, there is also the method of reactive film growth using Mg for the tablets. However, there are problems such as film quality being unstable and the oxidizing atmosphere shortening the life of the electron gun with this method.

Incidentally, MgO film growth processes take up a large amount of the time in the PDP fabrication process. However, the film growth speeds are insufficient with the above methods, and they are preventing improvements in PDP productivity.

SUMMARY OF THE INVENTION

Therefore, an object of the present invention is to provide a film growth method for fast formation of magnesium oxide films of high quality.

Another object of the present invention is to provide a film growth apparatus for magnesium oxide films that is suitable for implementing the above-mentioned film growth method.

A magnesium oxide film growth method according to the present invention comprises the steps of: guiding a plasma beam generated by a plasma beam generator that uses arc discharge into a hearth placed in a vacuum chamber as an anode; ionizing a vaporization material on the hearth; and depositing the ionized vaporization material on a surface of a substrate placed opposite to the hearth for film formation.

According to an aspect of the present invention, a ring-shaped permanent magnet is provided as an auxiliary anode, the ring-shaped permanent magnet being coaxial with a central axis of the hearth and being positioned so as to surround an upper area of the hearth. Mg is used as the vaporization material. Gas mixed with oxygen is supplied into the vacuum chamber. Mg particles sublimated from the hearth react with oxygen plasma generated by the plasma to form an Mgo film on the substrate.

A magnesium oxide film growth apparatus according to the present invention comprises: a vacuum chamber; a plasma beam generator placed in the vacuum chamber, the plasma beam generator using arc discharge; and a hearth placed in the vacuum chamber to serve as an anode. A plasma beam generated by the plasma beam generator is guided into the hearth in the vacuum chamber to ionize a vaporization material on the hearth. The ionized vaporization material is deposited on a surface of a substrate placed opposite to the hearth for film formation.

According to an aspect of the present invention, an auxiliary anode is coaxial with a central axis of the hearth and is positioned around the hearth so as to surround an upper area of the hearth, the auxiliary anode comprising a ring-shaped permanent magnet. Mg is used as the vaporization material. The vacuum chamber has a supply unit to supply gas mixed with oxygen therein. As a result, Mg particles sublimated from the hearth react with oxygen plasma generated by the plasma to form an MgO film on the substrate.

DESCRIPTION OF THE PREFERRED EMBODIMENT

Figure 1:
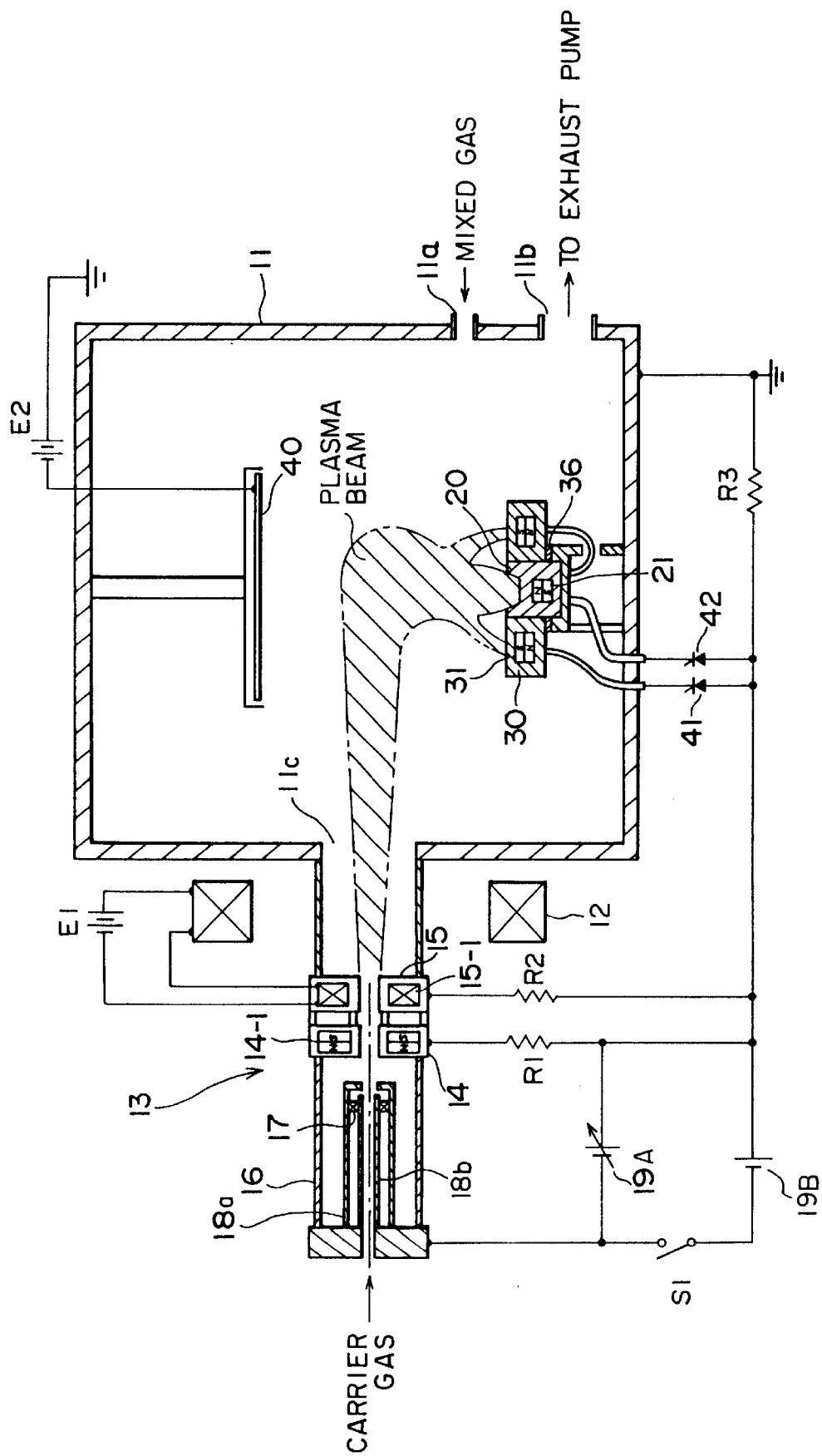
FIG. 1 is a vertical cross-sectional view of a film growth apparatus implementing the present invention.
Figure 2:
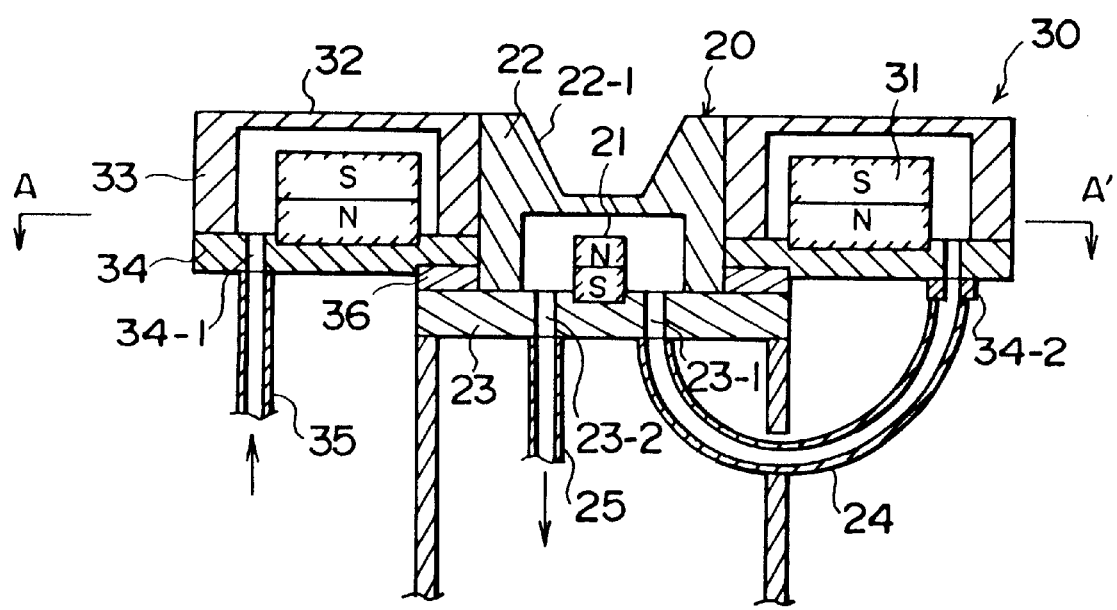
FIG. 2 is a vertical cross-sectional view showing a hearth, an auxiliary anode, and associated components in FIG. 1.
Figure 3:
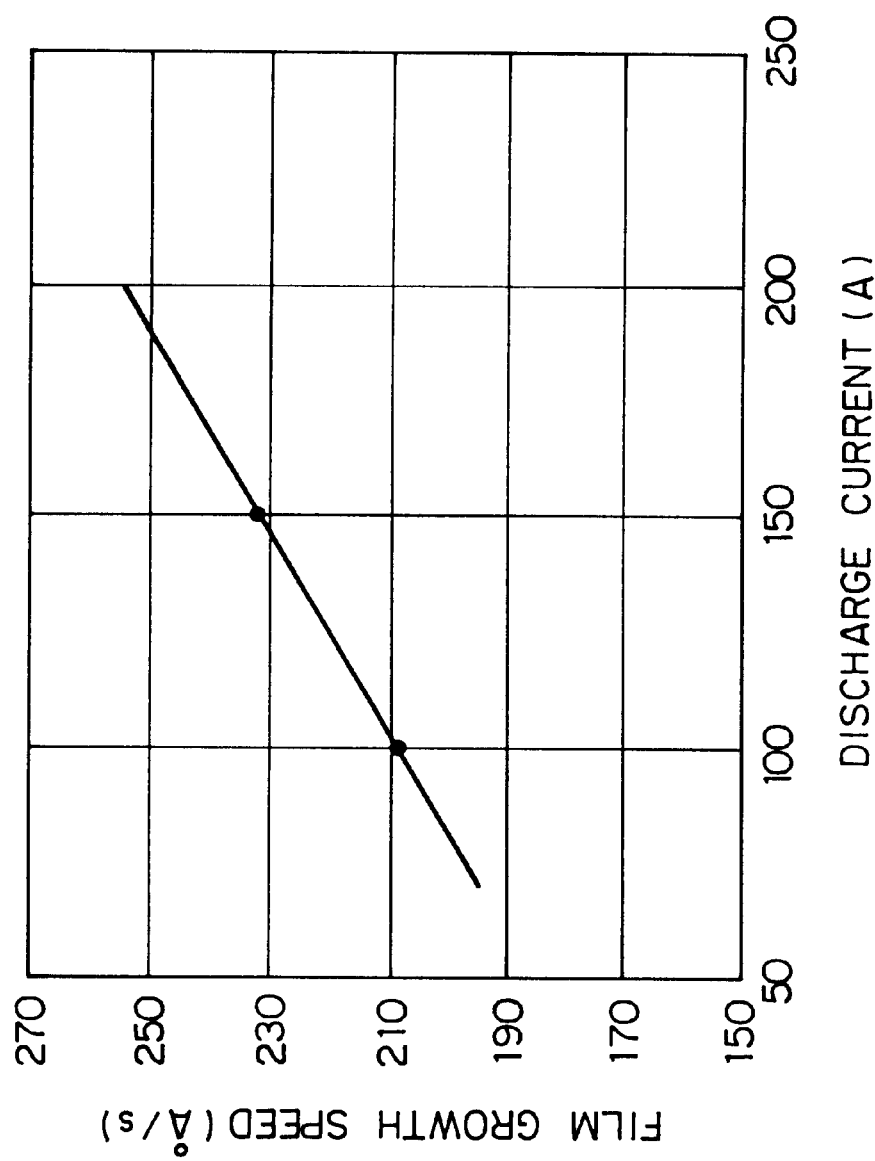
FIG. 3 is a graphical representation of a film growth speed as a function of a discharge current available in the film growth apparatus shown in FIG. 1.

Referring to FIGS. 1 and 2, an MgO film growth apparatus according to a preferred embodiment of the present invention is described. The MgO film growth apparatus used in the present invention basically has the same configuration as shown in Japanese Patent Laid-Open No. 07-316794, which has already been applied for by the same applicant. In FIG. 1, a gas inlet 11a for the gas mixture, such as argon $(Ar)+O_2$, that includes $O_2$ and a gas exhaust outlet 11b are attached to a vacuum chamber 11. The gas exhaust outlet 11b is connected to an exhaust pump that is not shown in the figure. A plasma beam generator 13 is attached to a mounted inlet 11c formed on the wall of the vacuum chamber.

It is sufficient for the plasma beam generator 13 to be one that uses arc discharge, and for example, pressure gradient plasma sources and HCD plasma sources are known. In order for guiding and convergence the plasma beam, a steering coil 12 is set up on the outside of the vacuum chamber 11 wall so as to surround the mounted inlet 11c. A first intermediate electrode 14 and a second intermediate electrode 15 used for plasma beam convergence are arranged concentrically in the plasma beam generator 13. The first intermediate electrode 14 houses a permanent magnet 14-1 so that it is parallel to the central axis of the plasma beam generator, and the second intermediate electrode 15 houses a coil 15-1. A circular plate 17 made of $LaB_6$, a tube 18a made of molybdenum (Mo) that can introduce the carrier gas and a pipe 18b made of tantalum (Ta) are housed in the insulator tube (glass tube) 16 for the plasma beam generator 13.

A main power supply 19A is connected through a resistor R1 between the plasma beam generator 13 itself and the first intermediate electrode 14. An auxiliary discharge power supply 19B is connected to a series connection circuit in parallel with the main power supply 19A. The common junction of the positive sides of the main power supply 19A and the auxiliary discharge power supply 19B is connected to the second intermediate electrode 15 through a resistor R2. The above mentioned common connection is connected to the main body of the vacuum chamber 11 as well as being grounded through a resistor R3. In addition, both an auxiliary anode 30, through a current control element 41, and a hearth 20, through a current control element 42, are connected to the above-mentioned common connection. The coil 15-1 in the second intermediate electrode 15, along with the steering coil 12, is connected to the first direct current power supply E1 used for excitation. On the other hand, the hearth 20, which is combined with the auxiliary anode 30, is arranged in the vacuum chamber. Above the hearth 20, there is an opposed arrangement of the substrate 40, which receives the processed material, and the substrate is connected to the direct current power supply E2 for negative bias.

Substrates 40 are transported intermittently to the vacuum chamber 11 by the transport system not shown in the figure, and continuous film growth operations are possible; however, since the transport system is well known, figures and explanations are left out.

The hearth 20, combined with the auxiliary anode 30 is called the beam correcting composite hearth. As is shown in the enlargement in FIG. 2, a water cooling system is combined with the hearth 20 and an auxiliary anode 30. The hearth 20 has a permanent magnet 21 with the magnetic axis directed up and down, an upper plate 22, and a lower plate 23. The upper plate 22 has both a depression 22-1 for receiving the vaporization material above and a space of sufficient size to hold the permanent magnet 21 below. Mg tablets are used as the vaporization material. The lower plate 23 is fixed to the lower surface of the upper plate 22. Thus, a water-cooled space is formed in the hearth 20, and a water inlet 23-1 and a water outlet 23-2 are formed in the lower plate.

The auxiliary anode includes a ring-shaped permanent magnet 31 and a magnet case 32. The ring-shaped permanent magnet 31 is coaxial with the central axis of the hearth 20, and it is positioned so as to surround the upper area of the hearth 20 with the magnetic axis directed up and down. The magnet case 32 is positioned to leave a fixed space around the outer perimeter of the hearth 20, and the ring-shaped permanent magnet 31 is maintained in a position a little above the permanent magnet 21. The magnet case 32, has a ring-shaped upper case 33, which has sufficient space to hold the ring-shaped permanent magnet 31, and a ring-shaped lower case 34, which is fixed to the lower surface of this upper case 33. Thus, a water cooled space is also formed in the magnet case 32, and a water inlet 34-1 and a water outlet 34-2 are formed in the lower case 34.

Since in this example, the hearth 20 and the auxiliary anode 30 have the water cooling system in common, the cooling water passes through the water inlet 34-1 from a cooling water pipe 35. The cooling water in auxiliary anode 30 is introduced into the hearth 20 through a cooling water pipe 24 that connects the water outlet 34-2 and the water inlet 23-1. Furthermore, the cooling water in the hearth is removed through a cooling water pipe 25 connected to the water outlet 23-2.

In terms of the material for the upper plate 22 and the lower plate 23 making up the hearth and the upper case 33 and the lower case 34 making up the magnet case, both use conductors like copper with high thermal conductivity. In addition, the places where the lower plate 23 and the lower case 34 are joined are set up so an electrically insulating plate lies in between. In this example, the insulator between the hearth 20 and the auxiliary anode 30 is realized using the insulating plate 36 at the bottom of the hearth 20. On the other hand, the insulation of the side walls of the hearth 20 is realized by having a fixed space between the hearth 20 and the auxiliary anode 30. The permanent magnet 21 housed in the hearth 20 is used for the plasma beam guide, but there are cases where it is left out.

Returning to FIG. 1, the operation is described. If the switch S1 is turned on and the plasma beam generator 13 connected to the auxiliary discharge power supply (400V–600V high-voltage, low-current power supply) 19B, arc discharge begins in the plasma beam generator 13. In addition, the auxiliary current control element 41 on the anode 30 side is turned on, and the current control element 42 on the hearth 20 side is left in an off state. In this case, along with discharge starting between the first intermediate electrode 14 and the tube 18, it is easy to stabilize the plasma because the plasma beam current is flowing to the auxiliary anode 30. When the plasma has been stabilized, the main power source (low-voltage, high current power supply) 19A is gradually increased from a 0 current state, the switch S1 turned off, the current control element 41 on the auxiliary anode 30 side turned off and the current control element 42 on the hearth 20 side turned on for carrying out film growth operation.

In this example, a pressure of approximately $10^{-3}$–$10^{-4}$ Torr is maintained in the vacuum chamber 11. The plasma beam generated by the plasma beam generator 13 is guided to the hearth 20 by the steering coil 12 and the auxiliary anode 30. In particular, because of the combination with the auxiliary anode 30, it is easy for the plasma beam to be guided to the hearth 20. At this time, the Mg tablet placed on top of the hearth 20 is heated and sublimated by the plasma beam. On the other hand, the plasma beam also generates plasma along its path. In the vacuum chamber 11, gas mixed with $O_2$ is supplied by the gas inlet 11a, and oxygen plasma is generated by the plasma. The sublimated Mg particles react with the oxygen plasma, and as a result an MgO film is formed on the substrate 40.

This operation is the same in principle as so-called ion plating, but in the present invention, the electron temperatures and electron densities are both higher than in normal ion plating (without auxiliary anode 30). Thus, it is possible to form stable MgO films. Additionally, since the oxygen plasma collides with the Mg tablet, the surface temperature of the Mg tablet is increased further because of the oxidation heat, and combined with the creation of an MgO surface, this helps to improve the film growth speed.

Incidentally, the film growth speed in the case of vacuum vapor deposition is about 20–40 (A Is) (pressure being $10^{-4}$–$10^{-6}$ Torr). However, using the present invention, it was confirmed that a film growth speed of 200 (Å/s) (pressure being $7 \times 10^{-4}$ Torr) can be obtained.

As in the above explanation, along with Mg metal being used as the vaporization material in the present invention, a beam correcting composite hearth is used. The atmosphere in the vacuum chamber is a mixed gas that includes $O_2$, and it accelerates the growth of the MgO film on the substrate. Thus, a good MgO film can be formed at a high speed.

What is claimed is:

1. A magnesium oxide film growth method comprising the steps of:

guiding a plasma beam generated by a plasma beam generator that uses arc discharge into a hearth placed in a vacuum chamber as an anode;

ionizing vaporization material on said hearth;

depositing ionized vaporization material on a surface of a substrate placed opposite to the hearth for film formation, wherein said method further comprising of:

providing a ring-shaped permanent magnet as an auxiliary anode, said ring-shaped permanent magnet being coaxial with a central axis of said hearth and being positioned so as to surround an upper area of said hearth;

supplying, with magnesium (Mg) used as said vaporization material, gas mixed with oxygen into said vacuum chamber to react magnesium particles sublimated from said hearth with oxygen plasma generated by said plasma, the oxygen plasma colliding with a surface of the magnesium vaporization material such that the surface of the magnesium vaporization material is heated by oxidation heat, thereby forming a magnesium oxide (MgO) film on said substrate.

2. A magnesium oxide film growth method as claimed in claim 1, wherein a pressure of $1.3 \times 10^{-3}$ to $0.5 \times 10^{-4}$ Torr is maintained in said vacuum chamber during said film formation.

3. A magnesium oxide film growth method as claimed in claim 1, wherein the magnesium oxide film is deposited on a substrate which is later processed into a plasma display panel.

4. A magnesium oxide film growth method as claimed in claim 1, wherein the MgO film is formed at a film growth speed of about 200Å/s.

5. A magnesium oxide film growth method as claimed in claim 1, wherein the magnesium oxide film is deposited on a substrate which is later processed into a plasma display panel and the MgO film is formed at a film growth speed of about 200Å/s.

6. A magnesium oxide film growth method as claimed in claim 1, wherein the plasma beam is guided by a steering coil located outside the vacuum chamber.

7. A magnesium oxide film growth method as claimed in claim 6, wherein the plasma beam is converged by first and second electrodes housing permanent magnets parallel to the central axis of the beam generator.

8. A magnesium oxide film growth method as claimed in claim 1, wherein the substrate is removed from the vacuum chamber by a transport system, a further substrate is moved into the vacuum chamber and a magnesium oxide film is formed on the further substrate.

9. A magnesium oxide film growth method as claimed in claim 1, wherein the auxiliary anode includes a magnet case housing the ring-shaped permanent magnet in a water cooled space, the method including passing cooling water into the water cooled space in the magnet case after which the cooling water passes into a space in the hearth and is removed from the hearth.

10. A magnesium oxide film growth method as claimed in claim 1, wherein the hearth is electrically connected to a power source by a current control element and the auxiliary anode is electrically connected to the power source by an auxiliary current control element, the method including turning the auxiliary current control element on so as to supply power to the auxiliary anode and turning the current control element off so as to prevent power from being supplied to the hearth during the step of forming the magnesium oxide film on the substrate.

* * * * *